US012131795B2

(12) United States Patent
Rayaprolu et al.

(10) Patent No.: US 12,131,795 B2
(45) Date of Patent: Oct. 29, 2024

(54) ADAPTIVE TEMPERATURE COMPENSATION FOR A MEMORY DEVICE

(71) Applicant: MICRON TECHNOLOGY, INC., Boise, ID (US)

(72) Inventors: Vamsi Pavan Rayaprolu, Santa Clara, CA (US); Steven Michael Kientz, Westminster, CO (US)

(73) Assignee: Micron Technology, Inc., Boise, ID (US)

(*) Notice: Subject to any disclaimer, the term of this patent is extended or adjusted under 35 U.S.C. 154(b) by 193 days.

(21) Appl. No.: 17/856,691

(22) Filed: Jul. 1, 2022

(65) Prior Publication Data

US 2023/0395099 A1 Dec. 7, 2023

Related U.S. Application Data

(60) Provisional application No. 63/347,912, filed on Jun. 1, 2022.

(51) Int. Cl.
| | |
|---|---|
| *G11C 7/04* | (2006.01) |
| *G11C 16/26* | (2006.01) |
| *G11C 16/34* | (2006.01) |
| *H03K 19/17728* | (2020.01) |

(52) U.S. Cl.
CPC ............ *G11C 7/04* (2013.01); *G11C 16/26* (2013.01); *G11C 16/3495* (2013.01); *H03K 19/17728* (2013.01)

(58) Field of Classification Search
CPC ....... G11C 7/04; G11C 16/26; G11C 16/3495; H03K 19/17728
See application file for complete search history.

(56) References Cited

U.S. PATENT DOCUMENTS 11,494,261 B2 * 11/2022 Achtenberg ....... G11C 16/3495

* cited by examiner

*Primary Examiner* — Sultana Begum
(74) *Attorney, Agent, or Firm* — LOWENSTEIN SANDLER LLP

(57) ABSTRACT

A first analysis of each respective die of a multi-die memory device is performed. An equation to determine a respective temperature compensation (tempco) value for each respective die based on a number of program erase cycles (PECs) of the respective die based on the first analysis s determined. The equation for use in processing memory access requests directed to the respective die is stored. Whether to update the equation directed to the respective die based on a second analysis of the respective die is determined.

15 Claims, 5 Drawing Sheets

| Die | Parameter | Parameter |
|---|---|---|
| Die 1 | P1 | P2 |
| Die 2 | P1 | P2 |
| Die 3 | P1 | P2 |
| Die 4 | P1 | P2 |
| Die 5 | P1 | P2 |
| Die 6 | P1 | P2 |
| Die 7 | P1 | P2 |
| Die 8 | P1 | P2 |
| ... | ... | ... |
| Die N | P1 | P2 |

FIG. 2

ADAPTIVE TEMPERATURE COMPENSATION FOR A MEMORY DEVICE

RELATED APPLICATIONS

This application claims the benefit of U.S. Provisional Patent Application No. 63/347,912, filed Jun. 1, 2022, the entirety of which is incorporated herein by reference.

TECHNICAL FIELD

Embodiments of the disclosure relate generally to memory sub-systems, and more specifically, relate to adaptive temperature compensation for a memory device.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding only.

FIG. 2 illustrates an example of a table including a set of parameters for adaptive temperature compensation, in accordance with some embodiments of the present disclosure;

DETAILED DESCRIPTION

Figure 1:
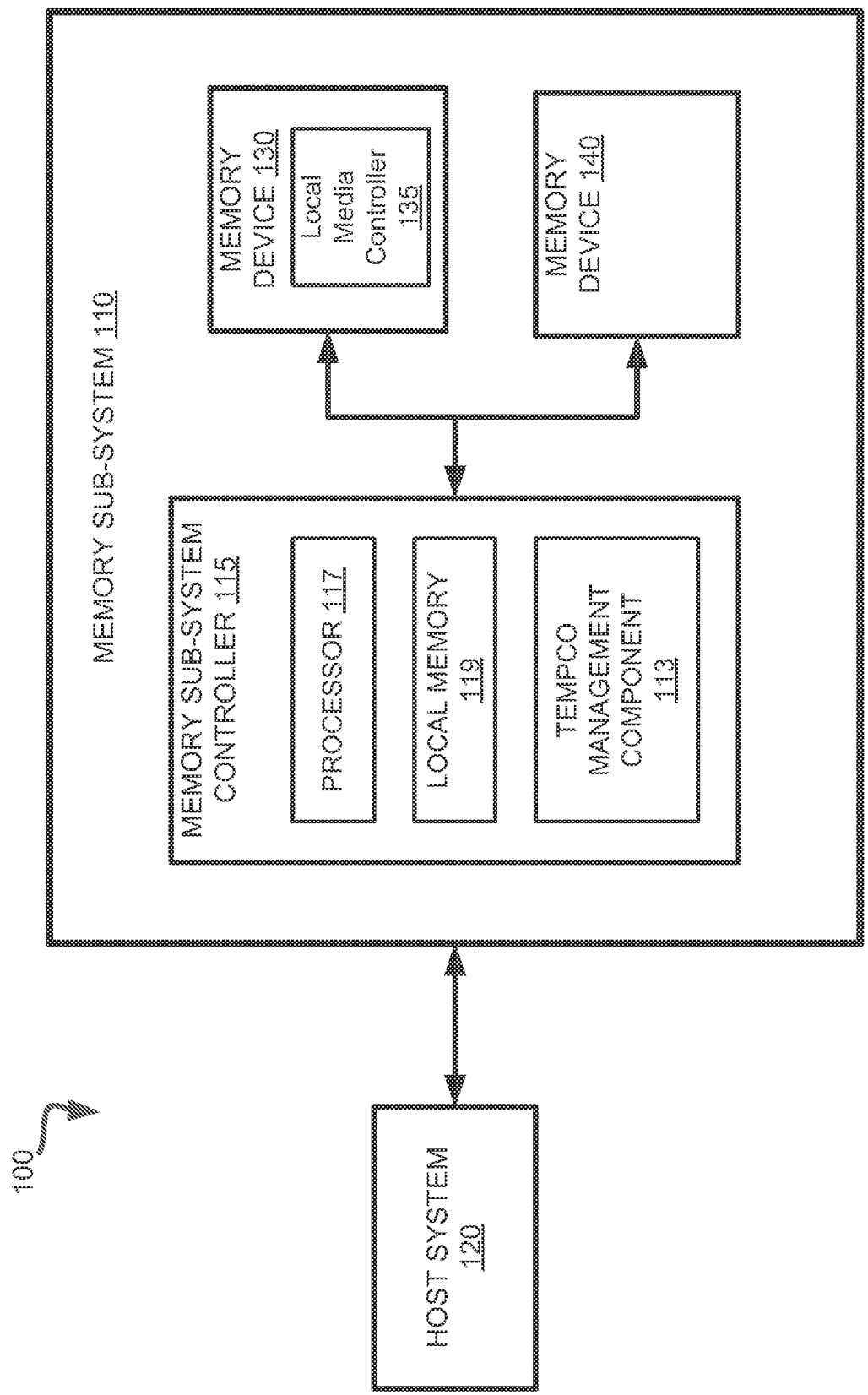
FIG. 1 illustrates an example computing system that includes a memory sub-system in accordance with some embodiments of the present disclosure.

Aspects of the present disclosure are directed to adaptive temperature compensation for a memory device. A memory sub-system can be a storage device, a memory module, or a combination of a storage device and memory module. Examples of storage devices and memory modules are described below in conjunction with FIG. 1. In general, a host system can utilize a memory sub-system that includes one or more components, such as memory devices that store data. The host system can provide data to be stored at the memory sub-system and can request data to be retrieved from the memory sub-system.

A memory sub-system can include high density non-volatile memory devices where retention of data is desired when no power is supplied to the memory device. One example of non-volatile memory devices is a negative-and (NAND) memory device. Other examples of non-volatile memory devices are described below in conjunction with FIG. 1. A non-volatile memory device is a package of one or more dies. Each die can consist of one or more planes. For some types of non-volatile memory devices (e.g., NAND devices), each plane consists of a set of physical blocks. Each block consists of a set of pages. Each page consists of a set of memory cells ("cells"). A cell is an electronic circuit that stores information. Depending on the cell type, a cell can store one or more bits of binary information, and has various logic states that correlate to the number of bits being stored. The logic states can be represented by binary values, such as "0" and "1", or combinations of such values.

A memory device can include multiple memory cells arranged in a two-dimensional or a three-dimensional grid. Memory cells are formed onto a silicon wafer in an array of columns (also hereinafter referred to as bitlines) and rows (also hereinafter referred to as wordlines). A wordline can refer to one or more rows of memory cells of a memory device that are used with one or more bitlines to generate the address of each of the memory cells. The intersection of a bitline and wordline constitutes the address of the memory cell. A block hereinafter refers to a unit of the memory device used to store data and can include a group of memory cells, a wordline group, a wordline, or individual memory cells. One or more blocks can be grouped together to form a plane of the memory device in order to allow concurrent operations to take place on each plane. The memory device can include circuitry that performs concurrent memory page accesses of two or more memory planes. For example, the memory device can include multiple access line driver circuits and power circuits that can be shared by the planes of the memory device to facilitate concurrent access of pages of two or more memory planes, including different page types. For ease of description, these circuits can be generally referred to as independent plane driver circuits. Depending on the storage architecture employed, data can be stored across the memory planes (i.e., in stripes). Accordingly, one request to read a segment of data (e.g., corresponding to one or more data addresses) can result in read operations performed on two or more of the memory planes of the memory device.

A memory cell can be programmed (written to) by applying a certain voltage to the memory cell, which results in an electric charge being held by the memory cell, thus allowing modulation of the voltage distributions in the memory device. Moreover, precisely controlling the amount of the electric charge stored by the memory cell allows for multiple threshold voltage levels corresponding to different logical levels, thus effectively allowing a single memory cell to store multiple bits of information. For example, a memory cell operated with $2n$ different threshold voltage levels is capable of storing n bits of information. Thus, the read operation can be performed by comparing the measured voltage exhibited by the memory cell to one or more reference voltage levels in order to distinguish between two logical levels for single-level cells and between multiple logical levels for multi-level cells.

Under certain circumstances, the memory device can be operated in an environment with varying temperatures (e.g., between 0 to 75 degrees Celsius). Even minor temperature variations over time, such as a period of time between when data is written to a memory cell and when data is read from the memory cell, can impact the voltages stored in and read from the memory cell. (e.g., causing a threshold voltage shift). This change in temperature between when the data is written and when the data is read from a memory cell can be referred to as the cross temperature. Cross temperature conditions occur when the memory cell is programmed at a hot temperature range (65-70° C.) and read at a cold temperature range (20-25° C.) or when the memory cell is programmed at a cold temperature range (20-25° C.) and read at a hot temperature range (65-70° C.). For illustrative purposes, temperature ranges (20-25° C.) and (65-70° C.) are used, but other temperature ranges are also possible. Accordingly, depending on how the threshold voltage ranges (i.e., levels) are defined in the memory cell, the apparent read voltage may reflect a different data value. This shift can result in an increased raw bit error rate (RBER), which can be beyond the error correction capability of the underlying error correction code (ECC).

In addition, the amount that the voltage shifts may change as the change in temperature increases over time. In other words, the voltage shift per degree Celsius may be larger at extreme temperatures (e.g., closer to 0° C. or 70° C.) than it is in a more moderate range (e.g., 15° C. to 30° C.). A temperature compensation ("tempco") value is an offset to be applied to a read voltage to compensate for the voltage shift due to temperature variation. The tempco value is based on cross temperature. Depending on manufacturing variations in memory cells and memory devices, memory cells on a particular die may exhibit relatively similar behavior with respect to voltage shifts in response to changes in temperature. Accordingly, each die in the memory device may have a separate tempco value rather than using a single tempco value for the entire memory device. In other embodiments, a tempco value for some other level of granularity can be used, such as per cell, per block, per package, or per device compensation value.

In conventional memory sub-systems, as each die of the memory device encounters program erase cycles (PECs), the tempco value associated with the die may not adequately compensate for voltage shift due to temperature variations at various PECs. To adjust for the effects PECs have on the tempco values of the dies of the memory device, a representative collection of dies from a plurality of manufactured dies may be worn (e.g., until each die of the representative collection has reached 10,000 PECs). Depending on the embodiment, the plurality of representative tempco values may be represented as a plurality of representative offset values from an initial representative tempco value (e.g., a difference between the representative tempco value at a specific PEC or range of PECs and the representative tempco value at 0 PECs). Accordingly, each die of the plurality of manufactured dies is characterized by obtaining one or more tempco values at low PECs (e.g., between 0-20 PECs) and comparing the one or more tempco values to the plurality of representative tempco values of each die of the representative collection to determine a die of the representative collections that have similar tempco values at low PECs (e.g., 0-20 PECs). Depending on the embodiment, the one or more tempco values at low PECs may be converted into offset values (e.g., a difference between the tempco value at 0 PECs and each of the one or more tempco values at low PECs). Thus, the one or more offset values may be compared to the plurality of representative offsets of each die of the representative collection. Based on the die of the representative collection that is closest to a respective die of the plurality of manufactured dies, the plurality of representative offsets is assigned to the respective die. Thus, a plurality of tempco values based on the plurality of representative offsets may be generated for the die. Depending on the embodiment, prior to and/or after generating the plurality of tempco values, depending on a desired number of steps (e.g., various PECs or ranges of PECs) between 0 PECs and 10,000 PECs, the conventional memory sub-system may linearly interpolate the plurality of representative offsets assigned to a respective die, or the plurality of tempco values generated from the plurality of representative offsets to provide additional steps (based on PEC) between 0 PECs and 10,000 PECs other than those provided by the plurality of representative offsets.

In conventional memory sub-systems, a lookup table including an entry for each die of the memory devices is generated. Each entry of the lookup table includes a plurality of tempco values by PEC generated using, for example, a linearly interpolated plurality of representative offsets assigned to the die. The conventional memory sub-system may receive a request to perform a memory access operation on a die of the memory device. The conventional memory sub-system may obtain a number of PECs experienced by the die. The conventional memory sub-system may further identify an entry of the lookup table associated with the die, and based on the number of PECs identified, among the plurality of tempco values associated with the entry, a tempco value associated with a range of PECs (or a specific number of PECs) that match the number of PECs obtained for the die. Since each entry of the lookup table associated with each die includes a plurality of tempco values, the lookup table tends to utilize a lot of memory to store the lookup table, thereby increasing storage utilization. Additionally, the plurality of tempco values associated with each die generated according to a characterization of the die may not account for die-to-die variations.

Aspects of the present disclosure address the above and other deficiencies by providing a memory sub-system that generates and updates a fitting equation to reduce the size of the lookup table used to determine a tempco value by PEC for a memory device. In particular, as described above, one or more tempco values may be determined for each of the dies of a memory device at low PECs (e.g., 0-20 PECs). Based on the one or more tempco values, each die of the memory device may be characterized. Accordingly, rather than including in each entry a plurality of tempco values by PECs generated by a plurality of representative offset values assigned to the die based on the characterization, the memory sub-system includes a set of parameters associated with a generated fitting equation associated with the plurality of tempco values by PECs (e.g., generated by the plurality of representative offset values assigned to the die based on the characterization).

The fitting equation may be, for example, a linear equation, a piece-wise linear equation, or a second-order linear equation. Accordingly, for each die, each of the plurality of tempco values by PECs are plotted on a graph with a y-axis of the graph representing the tempco value and an x-axis of the graph representing a number (or range) of PECs. The fitting equation (e.g., linear equation) can be fitted to the plurality of tempco values by PECs. Accordingly, the set of parameters associated with the generated fitting equation includes a slope parameter and an intercept parameter. The slope parameter represents a rate at which the tempco value changes as a function of PECs, and the intercept parameter represents a tempco value of the die at 0 PECs.

During operation of the memory device, the memory sub-system aggregates a plurality of tempco values (based on measurements of cross-temperatures values periodically measured at predetermined PECs of the die of the memory device (e.g., every 1% of a number of PECs associated with the end of life of the die)). Accordingly, the memory sub-system periodically (e.g., after each measurement at the predetermined PECs) performs an optimization operation on the plurality of tempco values by PECs of the die of the memory device to obtain an optimized slope and optimized intercept associated with the tempco value by PECs of the die. The optimization method may include a gradient descent, a stochastic gradient descent, linear regression, or any iterative process used to fit a line to a plurality of data points. Accordingly, upon determining the optimized slope and/or the optimized intercept, the memory sub-system updates a slope parameter and/or an intercept parameter of the set of parameters of the entry of the lookup table associated with the die with the optimized slope and/or the optimized intercept associated with the die, respectively.

Prior to, during, or after updating the set of parameters of a respective die of the memory device, the memory sub-system may receive a request to perform a memory access operation on the respective die of the memory device. Accordingly, the memory sub-system obtains a number of PECs experienced by the respective die. The memory sub-system may further identify an entry of the lookup table associated with the respective die to obtain the set of parameters (e.g., the slope parameter and the intercept parameter) for use in the fitting equation (e.g., linear equation) to determine a tempco value at the number of PECs. Thus, the tempco value at the number of PECs is a sum of (i) the slope parameter of the entry associated with the respective die multiplied by the number of PECs experienced by the respective die and (ii) the intercept parameter of the entry associated with the respective die.

Advantages of the present disclosure include, but are not limited to, providing a compact lookup table storing a set of parameters for use in a fitting equation to determine a tempco value by PECs, rather than a plurality of tempco values for each PEC or range of PECs, thereby reducing the memory footprint of the lookup table on the memory device. Additionally, updating the set of parameters to account for die-to-die variations, rather than a predetermined set of parameters based on the characterization of dies of the memory device with a representative collection of dies, thereby increasing the performance of the memory device.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a combination of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory modules (NVDEVIMs).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to multiple memory sub-systems 110 of different types. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the physical host interface (e.g., PCIe bus). The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include a negative-and (NAND) type flash memory and write-in-place memory, such as a three-dimensional cross-point ("3D cross-point") memory device, which is a cross-point array of non-volatile memory cells. A cross-point array of non-volatile memory cells can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), quad-level cells (QLCs), and penta-level cells (PLCs) can store multiple bits per cell. In some embodiments, each of the memory devices 130 can include one or more arrays of memory cells such as SLCs, MLCs, TLCs, QLCs, PLCs or any combination of such. In some embodiments, a particular memory device can include an SLC portion, and an MLC portion, a TLC portion, a QLC portion, or a PLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as a 3D cross-point array of non-volatile memory cells and NAND type flash memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, or electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processing device, which includes one or more processors (e.g., processor 117), configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., a logical block address (LBA), namespace) and a physical address (e.g., physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, memory sub-system 110 is a managed memory device, which is a raw memory device 130 having control logic (e.g., local media controller 135) on the die and a controller (e.g., memory sub-system controller 115) for media management within the same memory device package. An example of a managed memory device is a managed NAND (MNAND) device.

The memory sub-system 110 includes a temperature compensation (tempco) management 113 that can manage a set of parameters for each die of a plurality of dies of memory device in a tempco lookup table stored in the memory sub-system. In some embodiments, the memory sub-system controller 115 includes at least a portion of the tempco management component 113. In some embodiments, the tempco management component 113 is part of the host system 110, an application, or an operating system. In other embodiments, local media controller 135 includes at least a portion of tempco management component 113 and is configured to perform the functionality described herein.

The tempco management component 113 can identify one or more sets of predetermined tempco values (or tempco offset values) by PECs. For each die of the plurality of dies of memory device 130 and/or 140, the tempco management component 113 obtains a plurality of tempco values (based on cross-temperature (x-temp) measurements) at various low PECs (e.g., at 0 PECs, 5 PECs, 15 PECs, and 20 PECs). Accordingly, the tempco management component 113 may generate, from the plurality of tempco values at various low PECs, a plurality of tempco values at various low PECs. The tempco management component 113 may compare the plurality of tempco values at various low PECs of a respective die with each set of predetermined tempco values of the one or more sets of predetermined tempco values to characterize the respective die and apply the set of predetermined tempco value that best fits the plurality of tempco values at various low PECs. For example, based on PECs, each tempco value at a specific PEC is compared with a predetermined tempco value of the set of predetermined tempco values at the specific PEC to determine if the set of predetermined tempco values best fits the plurality of tempco values at various low PECs. Upon determining that the set of predetermined tempco values best fits the plurality of tempco values at various low PECs, the tempco management component 113 may apply the set of predetermined tempco values (or tempco offset values) by PECs to the respective die. Depending on the embodiment, the set of predetermined tempco values (or tempco offset values) by PECs applied to the respective die may be linearly interpolated to include more predetermined tempco values by PECs based on a desired number of steps.

Once each die of the plurality of dies is characterized, the tempco management component 113, for each die of the plurality of dies, generates a fitting equation (e.g., linear equation) to fit the set of predetermined tempco values (or tempco offset values) by PECs applied to a respective die or the linearly interpolated set of predetermined tempco values including additional predetermined tempco values by PECs. The fitting equation may include a set of parameters associated with the fitting equation (e.g., a slope of the fitting equation and an intercept of the fitting equation). Accordingly, for each die of the plurality of dies, the tempco management component 113 stores in an entry of a tempco lookup table the set of parameters associated with a respective die of the plurality of dies. Thus, each entry of the tempco lookup table corresponds to a die of the plurality of dies and includes a set of parameters (e.g., slope and intercept) for use in a linear equation. Depending on the embodiment, the tempco lookup table may be stored in the memory sub-system controller 115.

During the use of memory device 130 and/or 140, the tempco management component 113 may periodically, every predetermined number of PECs (e.g., every 100 PECs), obtain a tempco value (based on an x-temp measurement) for each die of the plurality of dies. That is, the tempco management component 113 maintains, for each die of the plurality of dies, a plurality of tempco values at specific PECs, which are continually updated with each new x-temp measurement. Accordingly, after each update of the plurality of tempco values, the tempco management component 113, for each die of the plurality of dies, performs an optimization method on the plurality of tempco values at specific PECs until an optimized slope and optimized intercept associated with the plurality of tempco values of a respective die is obtained. Once the optimized slope and/or the optimized intercept is obtained, the tempco management component 113 updates a set of parameters associated with the respective die based on the optimized slope and/or the optimized intercept of the respective die. For example, the tempco management component 113 updates a slope of the set of parameters associated with the respective die with the optimized slope associated with the respective die and/or an intercept of the set of parameters associated with the respective die with the optimized intercept associated with the respective die.

Regardless of when the memory sub-system controller 115 receives a request to perform a memory access operation on a die of the plurality of dies, the tempco management component 113 may obtain a number of PECs of the die. Additionally, the tempco management component 113 identifies from the tempco lookup table, stored in the memory sub-system controller 115, an entry corresponding to the die of the plurality of dies and obtains the set of parameters. The tempco management component 113, based on the number of PECs and the set of parameters, calculates a tempco value of the die at the number of PECs. In particular, the tempco management component 113 obtains a sum of (i) a slope of the set of parameters multiplied by the number of the PECs and (ii) an intercept of the set of parameters. Further details with regards to the operations of the tempco management component 113 are described below.

FIG. 2 schematically illustrates an example tempco lookup table for use in an adaptive equation to determine a tempco value for a die of a memory device, in accordance with embodiments of the present disclosure. The tempco lookup table 200 includes a plurality of entries 210. Each entry 210 corresponds to a die 220 (e.g., Die 2) and includes a set of parameters (e.g., parameter 230 and parameter 240).

For each entry 210 associated with a die 220 (e.g., Die 1-N), a plurality of tempco values (based on measurements of x-temp) at various low PECs are obtained and compared to one or more sets of predetermined tempco values stored in a memory sub-system of the memory device. Based on the comparison, a fitting equation (e.g., linear equation) for each dies 220 is performed on the set of predetermined tempco values having a subset of values that match the plurality of tempco values associated with die 220. Based on the fitting equation, for the die 220, a parameter 230 (e.g., a slope P1) and a parameter 240 (e.g., an intercept P2) are obtained from the fitting equation.

For every predetermined number of PECs, a tempco value (based on an x-temp measurement) is obtained for each die 220 and aggregated to a plurality of tempco values by PECs for die 220. An optimization method (e.g., stochastic gradient descent) is performed on the plurality of tempco values by PECs for the die 220, after every predetermined number of PECs, to determine an optimized slope and optimized intercept to replace parameter 230 (e.g., slope P1) and parameter 240 (e.g., intercept P2), respectively. Accordingly, once the optimized slope and/or optimized intercept is determined for die 220, parameter 230 (e.g., slope P1) of entry 210 associated with die 220 is replaced with the optimized slope for die 220, and parameter 240 (e.g., intercept P2) of entry 210 associated with die 220 is replaced with the optimized intercept for die 220.

To determine a tempco value by PEC for a die 220 (e.g., Die 1), a number of PECs (e.g., x_PECs) experienced by die 220 (e.g., Die 1) is determined. Die 220 (e.g., Die 1) associated with an entry 210 is identified. The parameter 230 (e.g., slope P1) and parameter 240 (e.g., intercept P2) of the corresponding entry 210 associated with die 220 (e.g., Die 1) are entered into the fitting equation (e.g., a linear equation). For example, the linear equation is slope*PEC+intercept, thus P1*x_PECs+P2 is calculated to determine the tempco value by PEC to apply to the memory operation on the die 220 (e.g., Die 1).

Figure 3:
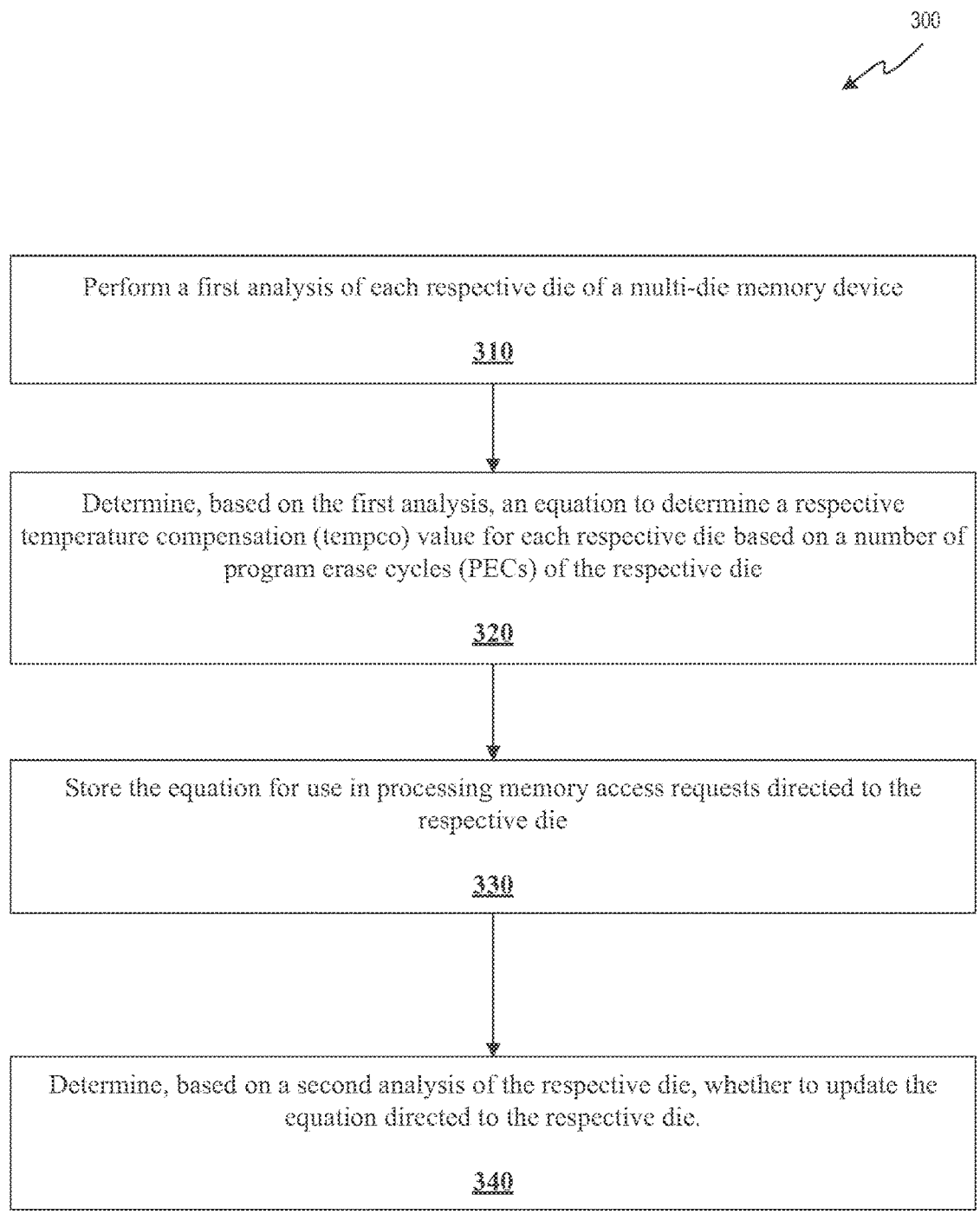
FIG. 3 is a flow diagram of an example method of adaptive temperature compensation, in accordance with some embodiments of the present disclosure.

FIG. 3 is a flow diagram of an example method 300 for temperature compensation of a memory device based on an adaptive equation, in accordance with some embodiments of the present disclosure. The method 300 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 300 is performed by the tempco management component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 310, the processing logic performs a first analysis of each respective die of a multi-die memory device. The processing logic, to perform the first analysis, obtains a plurality of tempco values based on cross-temperature measurements of the respective die at various PECs within a predetermined range. As previously described, one or more tempco values based on x-temp measurements may be determined for each of the die of the multi-die memory device at low PECs (e.g., 0-20 PECs).

At operation 320, the processing logic determines, based on the first analysis, an equation to determine a respective temperature compensation (tempco) value for each respective die based on a number of program erase cycles (PECs) of the respective die. The processing logic, to determine the equation, identifies a set of predetermined tempco values to characterize a respective die. Based on the characterization, the processing logic generates an equation. The equation may be one of a linear equation, a piece-wise linear equation, or a second order linear equation. As previously described, the one or more tempco values of a respective die are compared to a plurality of representative tempco values. Based on a subset of representative tempco values of the plurality of representative tempco values matching the one or more tempco values of the respective die, the processing logic characterizes the respective die as being similar to the representative tempco values and assigns the representative tempco values to the respective die. Accordingly, the equation is a fitting equation applied to the one or more tempco values expanded by the representative tempco values (e.g., a fitting equation of the one or more tempco values expanded by the representative tempco values (y-axis) by PECs (x-axis)).

At operation 330, the processing logic stores the equation for use in processing memory access requests directed to the respective die. The processing logic stores the equation by storing a first parameter and a second parameter for use in the equation directed to the respective die. As previously described, the first parameter (e.g., a slope parameter) represents a rate at which the tempco value changes as a function of PECs, and a second parameter (e.g., an intercept parameter) represents a tempco value of the die at 0 PECs.

At operation 340, the processing logic determines, based on a second analysis of the respective die, whether to update the equation directed to the respective die. The processing logic, to perform the second analysis, periodically, every predetermined number of PECs obtains a tempco value based on cross-temperature measurements of the respective die. The periodically obtained the tempco values are aggregated into a historical record of the tempco values of the respective die at various predetermined number of PECs. As previously described, during the operation of the memory device, the processing logic aggregates a plurality of tempco values (based on measurements of cross-temperatures values periodically measured at predetermined PECs of the die of the memory device (e.g., every 1% of a number of PECs associated with the end of life of the die)).

In some embodiments, the processing logic performs an optimization method on the historical record of the tempco values of the respective die to obtain at least one of: an optimized slope and/or an optimized intercept of the historical record. Responsive to obtaining at least one of: an optimized slope and/or an optimized intercept, the processing logic updates a first parameter of the equation with the optimized slope and a second parameter of the equation with the optimized intercept. The optimization method may be one of: a gradient descent, a stochastic gradient descent, or a linear regression.

Figure 4:
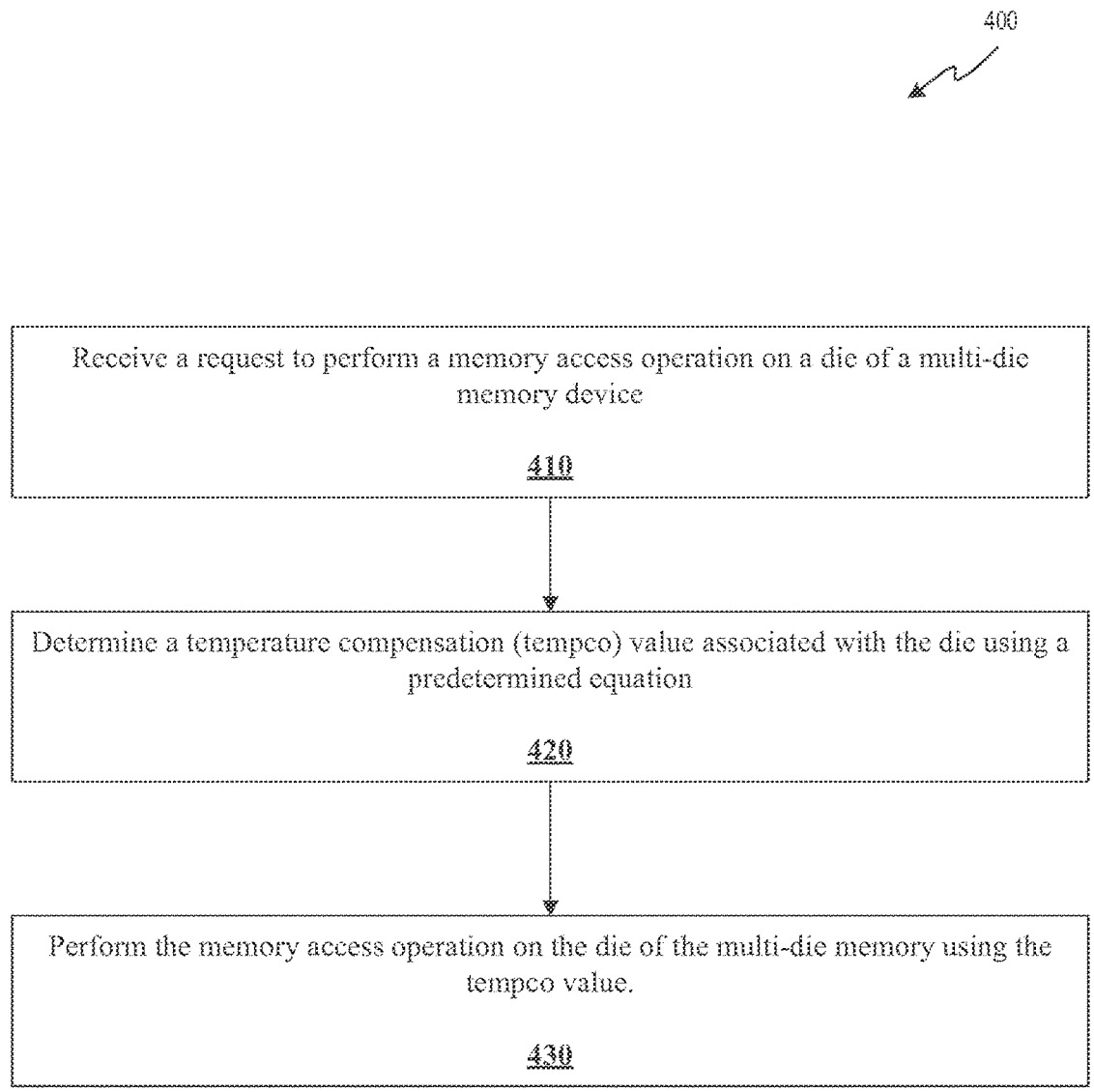
FIG. 4 is a flow diagram of an example method of adaptive temperature compensation, in accordance with some embodiments of the present disclosure.

FIG. 4 is a flow diagram of an example method 400 for temperature compensation of a memory device based on an adaptive equations, in accordance with some embodiments of the present disclosure. The method 400 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 400 is performed by the tempco management component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 410, the processing logic receives a request to perform a memory access operation on a die of a multi-die memory device. At operation 420, the processing logic determines a temperature compensation (tempco) value associated with the die using a predetermined equation. The predetermined equation may be one of a linear equation, a piece-wise linear equation, or a second-order linear equation. As previously described, the predetermined equation is based on a fitting equation associated with each die of the multi-die memory device. In particular, as previously described, one or more tempco values at various low PECs for each die of the multi-die memory device are obtained. For each die, classify a respective die by comparing the one or more tempco values at various low PECs with one or more sets of predetermined tempco values by PECs. Based on the classification applying the set of predetermined tempco values by PECs associated with the die. Accordingly, generating a fitting equation associated with the applied set of predetermined tempco values by PECs. The slope and intercept (e.g., set of parameters) of each fitting equation associated with a die of the multi-die memory device is stored in a look up table.

The processing logic, to determine the tempco value, determines a number of program erase cycle (PEC) count of the die. The processing logic obtains, from the look up table, a set of parameters associated with the die for use in the equation to calculate the tempco value using the number of PECs. The set of parameters associated with a die may be a slope parameter associated with the equation and an intercept parameter associated with the equation. Accordingly, the equation is the slope parameter multiplied by the number of PECs plus the intercept parameter. At operation 430, the processing logic performs the memory access operation on the die of the multi-die memory using the tempco value.

Depending on the embodiment, the set of parameters may be updated based on an optimization method of a historical record of tempco values of the die at various predetermined number of PECs. As previously described, the processing logic performs the optimization method on the historical record of the tempco values of a respective die to obtain at least one of: an optimized slope and/or an optimized intercept of the historical record. Responsive to obtaining at least one of: an optimized slope and/or an optimized intercept, the processing logic updates the slope parameter with the optimized slope and the intercept parameter with the optimized intercept. The optimization method may be one of: a gradient descent, a stochastic gradient descent, or a linear regression.

Figure 5:
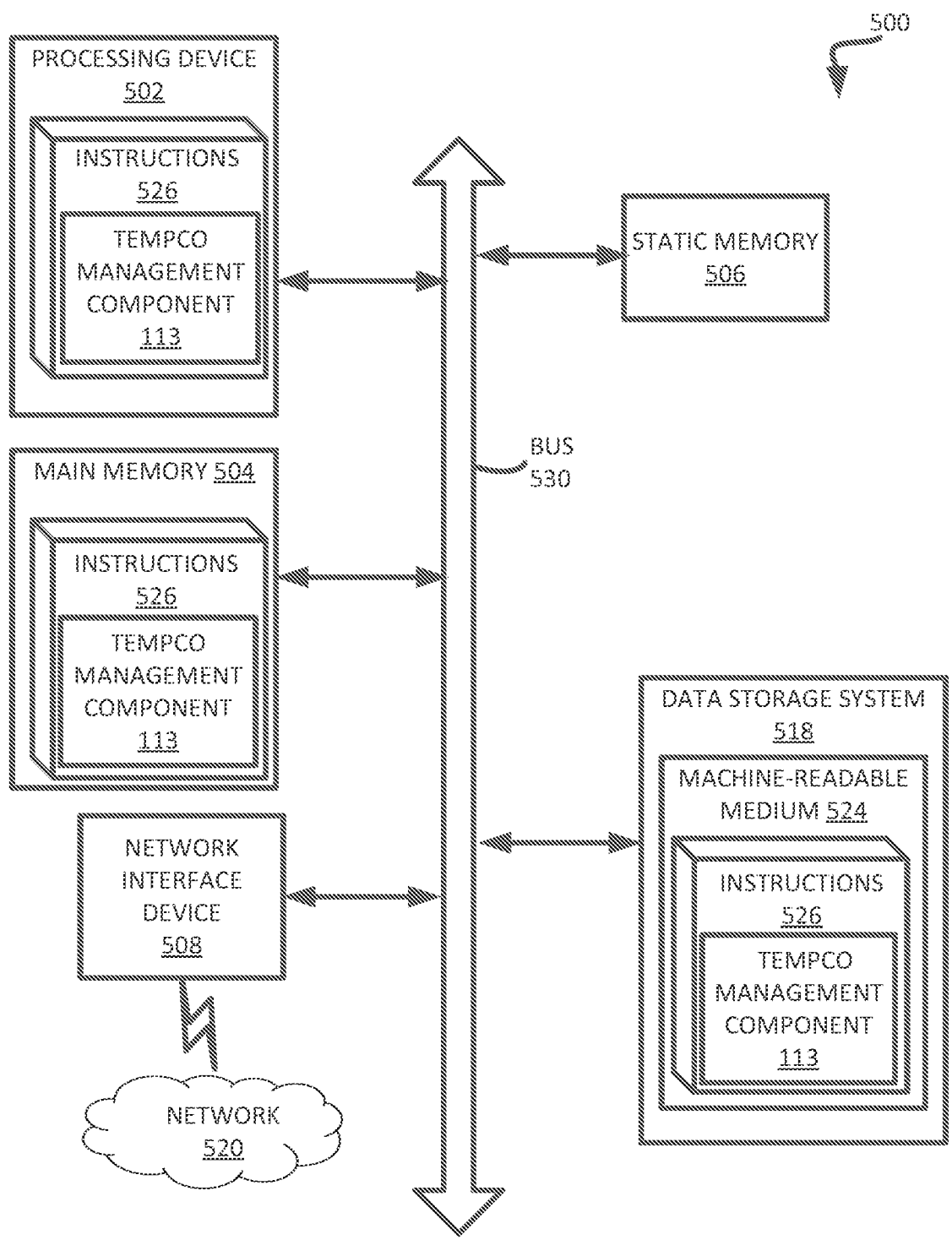
FIG. 5 is a block diagram of an example computer system in which embodiments of the present disclosure may operate.

FIG. 5 illustrates an example machine of a computer system 500 within which a set of instructions, for causing the machine to perform any one or more of the methodologies discussed herein, can be executed. In some embodiments, the computer system 500 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the tempco management component 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 500 includes a processing device 502, a main memory 504 (e.g., read-only memory (ROM), flash memory, dynamic random access memory (DRAM) such as synchronous DRAM (SDRAM) or RDRAM, etc.), a static memory 506 (e.g., flash memory, static random access memory (SRAM), etc.), and a data storage system 518, which communicate with each other via a bus 530.

Processing device 502 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 502 can also be one or more special-purpose processing devices such as an application specific integrated circuit (ASIC), a field programmable gate array (FPGA), a digital signal processor (DSP), network processor, or the like. The processing device 502 is configured to execute instructions 526 for performing the operations and steps discussed herein. The computer system 500 can further include a network interface device 508 to communicate over the network 520.

The data storage system 518 can include a machine-readable storage medium 524 (also known as a computer-readable medium) on which is stored one or more sets of instructions 526 or software embodying any one or more of the methodologies or functions described herein. The instructions 526 can also reside, completely or at least partially, within the main memory 504 and/or within the processing device 502 during execution thereof by the computer system 500, the main memory 504 and the processing device 502 also constituting machine-readable storage media. The machine-readable storage medium 524, data storage system 518, and/or main memory 504 can correspond to the memory sub-system 110 of FIG. 1.

In one embodiment, the instructions 526 include instructions to implement functionality corresponding to a QLC compaction component (e.g., the tempco management component 113 of FIG. 1). While the machine-readable storage medium 524 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A method comprising:
    obtaining respective pluralities of first temperature compensation (tempco) values based on cross-temperature measurements for a plurality of dies of a multi-die memory device at various program erase cycles (PECs) within a predetermined range;
    for each die of the plurality of dies, determining, based on a respective plurality of first tempco values of the respective pluralities of first tempco values of a respective die, a fitting equation to identify a first tempco value of the respective plurality of first tempco values for the respective die based on a number of program erase cycles (PECs) of the respective die;
    storing a set of parameters associated with the fitting equation for use in processing memory access requests directed to the respective die;
    obtaining respective pluralities of second tempco values for the plurality of dies;
    performing an optimization method on the plurality of the second tempco values of the respective die;
    obtaining, based on the optimization method, an optimized slope and an optimized intercept of the plurality of second tempco values; and
    updating a first parameter of the set of parameters with the optimized slope and a second parameter of the set of parameters with the optimized intercept.

2. The method of claim 1, wherein determining the fitting equation comprises:
    identifying a set of predetermined tempco values;
    characterizing, based on the set of predetermined tempco values, the respective die; and
    generating the fitting equation based on the characterization of the respective die.

3. The method of claim 2, wherein storing the set of parameters associated with the fitting equation for use in processing memory access requests directed to the respective die comprises:
    storing a first parameter of the set of parameters and a second parameter of the set of parameters.

4. The method of claim 1, wherein the optimization method is one of: a gradient descent, a stochastic gradient descent, or a linear regression.

5. The method of claim 1, wherein the fitting equation is one of: a linear equation, a piece-wise linear equation, or a second order linear equation.

6. A system comprising:
    a memory device; and
    a processing device, operatively coupled to the memory device, the processing device to perform operations comprising:
        obtaining respective pluralities of first temperature compensation (tempco) values based on cross-temperature measurements for a plurality of dies of a multi-die memory device at various program erase cycles (PECs) within a predetermined range;
        for each die of the plurality of dies, determining, based on a respective plurality of first tempco values of the respective pluralities of first tempco values of a respective die, a fitting equation to identify a first tempco value of the respective plurality of first tempco values for the respective die based on a number of program erase cycles (PECs) of the respective die;
        storing a set of parameters associated with the fitting equation for use in processing memory access requests directed to the respective die;
        obtaining respective pluralities of second tempco values for the plurality of dies;
        performing an optimization method on the plurality of the second tempco values of the respective die;
        obtaining, based on the optimization method, an optimized slope and an optimized intercept of the plurality of second tempco values; and
        updating a first parameter of the set of parameters with the optimized slope and a second parameter of the set of parameters with the optimized intercept.

7. The system of claim 6, wherein determining the fitting equation, the processing device is to further perform operations comprising:
    identifying a set of predetermined tempco values;
    characterizing, based on the set of predetermined tempco values, the respective die; and
    generating the fitting equation based on the characterization of the respective die.

8. The system of claim 7, wherein storing the set of parameters associated with the fitting equation for use in processing memory access requests directed to the respective die, the processing device is to further perform operations comprising:
    storing a first parameter of the set of parameters and a second parameter of the set of parameters.

9. The system of claim 6, wherein the optimization method is one of: a gradient descent, a stochastic gradient descent, or a linear regression.

10. The system of claim 6, wherein the fitting equation is one of: a linear equation, a piece-wise linear equation, or a second order linear equation.

11. A non-transitory computer readable storage medium including instructions that, when executed by a processing device, cause the processing device to perform a method comprising:
    obtaining respective pluralities of first temperature compensation (tempco) values based on cross-temperature measurements for a plurality of dies of a multi-die memory device at various program erase cycles (PECs) within a predetermined range;

for each die of the plurality of dies, determining, based on a respective plurality of first tempco values of the respective pluralities of first tempco values of a respective die, a fitting equation to identify a first tempco value of the respective plurality of first tempco values for the respective die based on a number of program erase cycles (PECs) of the respective die;

storing a set of parameters associated with the fitting equation for use in processing memory access requests directed to the respective die;

obtaining respective pluralities of second tempco values for the plurality of dies;

performing an optimization method on the plurality of the second tempco values of the respective die;

obtaining, based on the optimization method, an optimized slope and an optimized intercept of the plurality of second tempco values; and updating a first parameter of the set of parameters with the optimized slope and a second parameter of the set of parameters with the optimized intercept.

12. The non-transitory computer readable storage medium of claim 11, wherein determining the fitting equation comprises:

identifying a set of predetermined tempco values;

characterizing, based on the set of predetermined tempco values, the respective die; and generating the fitting equation based on the characterization of the respective die.

13. The non-transitory computer readable storage medium of claim 12, wherein storing the set of parameters associated with the fitting equation for use in processing memory access requests directed to the respective die comprises:

storing a first parameter of the set of parameters and a second parameter of the set of parameters.

14. The non-transitory computer readable storage medium of claim 12, wherein the optimization method is one of: a gradient descent, a stochastic gradient descent, or a linear regression.

15. The non-transitory computer readable storage medium of claim 11, wherein the fitting equation is one of: a linear equation, a piece-wise linear equation, or a second order linear equation.

* * * * *